(12) United States Patent
Cho et al.

(10) Patent No.: US 7,492,240 B1
(45) Date of Patent: Feb. 17, 2009

(54) INTEGRATED CAPACITOR AND INDUCTOR

(75) Inventors: Chahee P. Cho, Lansdale, PA (US);
William A. Lynch, Philadelphia, PA (US); Thong N. Ly, Sicklerville, NJ (US); Richard A. McConnell, Mullica Hill, NJ (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 167 days.

(21) Appl. No.: 11/543,283

(22) Filed: Sep. 28, 2006

Related U.S. Application Data

(60) Provisional application No. 60/832,004, filed on Jul. 14, 2006.

(51) Int. Cl.
*H03H 7/00* (2006.01)
(52) U.S. Cl. .................. 333/185; 333/174; 333/181
(58) Field of Classification Search .............. 333/174, 333/181, 185
See application file for complete search history.

(56) References Cited

U.S. PATENT DOCUMENTS

| | | | |
|---|---|---|---|
| 4,614,925 A * | 9/1986 | Kane ..................... 333/174 |
| 5,039,964 A * | 8/1991 | Ikeda ..................... 333/181 |
| 5,111,169 A | 5/1992 | Ikeda |
| 5,592,134 A | 1/1997 | Ogata et al. |
| 6,346,865 B1 * | 2/2002 | Callewaert et al. .......... 333/185 |
| 6,414,568 B1 | 7/2002 | Matsumura et al. |
| 6,661,079 B1 | 12/2003 | Bikulcius |
| 6,853,267 B2 | 2/2005 | Chiba et al. |

* cited by examiner

*Primary Examiner*—Jean B Jeanglaude
(74) *Attorney, Agent, or Firm*—Dave A. Ghatt

(57) ABSTRACT

An integrated capacitor and inductor device for separate use as a capacitor and inductor. The device has a four-terminal arrangement having separate capacitor and inductor terminals, which allows connection as two independent circuit elements within one physical package. The device includes a hollow vessel having an exposed integrated capacitor element, in which the exposed integrated capacitor element comprises at least a portion of the hollow vessel. The device also includes a coil winding at least partially within the hollow vessel, electrically communicating with the integrated capacitor element. The integrated capacitor and inductor device may be configured in a plurality of shapes, using different materials to maximize the effects of electric and magnetic fields.

19 Claims, 3 Drawing Sheets

100

200

INTEGRATED CAPACITOR AND INDUCTOR

CROSS-REFERENCE TO RELATED APPLICATIONS

This application claims the benefit of U.S. Provisional Application No. 60/832,004, filed Jul. 14, 2006, which is incorporated herein by reference.

STATEMENT OF GOVERNMENT INTEREST

The invention described herein may be manufactured and used by or for the Government of the United States of America for governmental purposes without the payment of any royalties thereon or therefore.

FIELD OF THE INVENTION

The present invention relates generally to an integrated capacitor and inductor device. More particularly, the present invention relates to a hybrid capacitor and inductor device capable of performing independently as a capacitor and an inductor.

BACKGROUND OF THE INVENTION

The U.S. Navy's drive toward development of an all-electric powered ship is increasing the demand for semiconductor based power electronics equipment to manage the conversion and control of electric power for many major systems and subsystems. Equipment based on existing semiconductor switch technology requires the installation of extensive passive filter networks to provide the level of electric power required for the Navy's sophisticated weapons, sensors, and equipment. These filtering components account for roughly two-thirds of the volume and the majority of the weight in the power electronics equipment typically used for Navy applications.

Because of size, weight, and the number of components, capacitor and inductor components tend to be difficult to handle during assembly, compared to other circuit components such as resistors and integrated circuit packages. Due to the relatively large size of filter capacitors and inductive components such as transformers, a more complicated process of assembly into electrical and electronic devices is required, as compared to smaller components.

In order to increase ship performance while improving payload and mission capability, it would be beneficial to have a new device involving technologies that reduces the size and weight of capacitance and inductive power filtering components. The device must meet Navy needs by being able to perform in high voltage, high current, high power and high energy devices. The device must be versatile and usable in multiple applications. The device should preferably reduce the number of components and increase the quality and capability over current systems.

SUMMARY OF THE INVENTION

The present invention addresses aspects of problems outlined above. Preferred embodiments of the present invention provide an integrated capacitor and inductor device with the capability to perform as both a capacitor and an inductor.

In one aspect, the invention is a hybrid capacitor and inductor device having a hollow vessel. According to this aspect, the hollow vessel has an exposed integrated capacitor element, wherein the exposed integrated capacitor comprises at least a portion of the hollow vessel. Additionally, the hollow vessel maybe either be of cylindrical form or toroidal form. The hybrid capacitor also includes a coil winding at least partially within the hollow vessel, the coil winding electrically communicating with the integrated capacitor element. The device further includes a first set of terminals connected to the integrated capacitor element to enable use as a capacitor, and a second set of terminals connected to the coil winding to enable use as an inductor.

In another aspect, the invention is an integrated capacitor and inductor device having a hollow vessel. The hollow vessel has an upper cover, a lower cover, and an integrated capacitor element. In this aspect, the hollow vessel has a cylindrical shape. The integrated capacitor and inductor device further includes a bobbin enclosed within the hollow vessel. The bobbin has an upper end face, a lower end face, and an axle connecting the upper end face to the lower end face. The upper end face corresponds to the upper cover and a lower end face corresponds to the lower cover. The device further includes a coil winding around the bobbin within the hollow vessel, and four terminals to enable separate use as a capacitor and an inductor. According to the invention, two of the four terminals are connected to the coil windings and the other two terminals are connected to the integrated capacitor element.

In another aspect, the invention is an integrated capacitor and inductor device having a hollow vessel with a toroidal shape. The device includes an exposed integrated capacitor element, wherein the exposed integrated capacitor element comprises at least a portion of the hollow vessel. The integrated capacitor and inductor device further includes a coil winding at least partially within the hollow vessel, and at least partially outside the hollow vessel. The coil winding electrically communicates with the integrated capacitor element. The device further includes four terminals to enable separate use as a capacitor and an inductor, with two of the four terminals connected to the coil windings and the other two terminals connected to the integrated capacitor element. According to the invention the capacitive element has an inner surface portion, an outer surface portion, a top surface portion, and a bottom surface portion. The coil winding is wound around the inner surface portion, the outer surface portion, the top surface portion, and the bottom surface portion. Additionally, the inner surface portion and the outer surface portion each comprise either a ferromagnetic layer or a dielectric layer, and the top surface portion and bottom surface portion each comprise either a ferromagnetic layer or a dielectric layer.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein.

DETAILED DESCRIPTION OF PREFERRED EMBODIMENT

Figure 1:
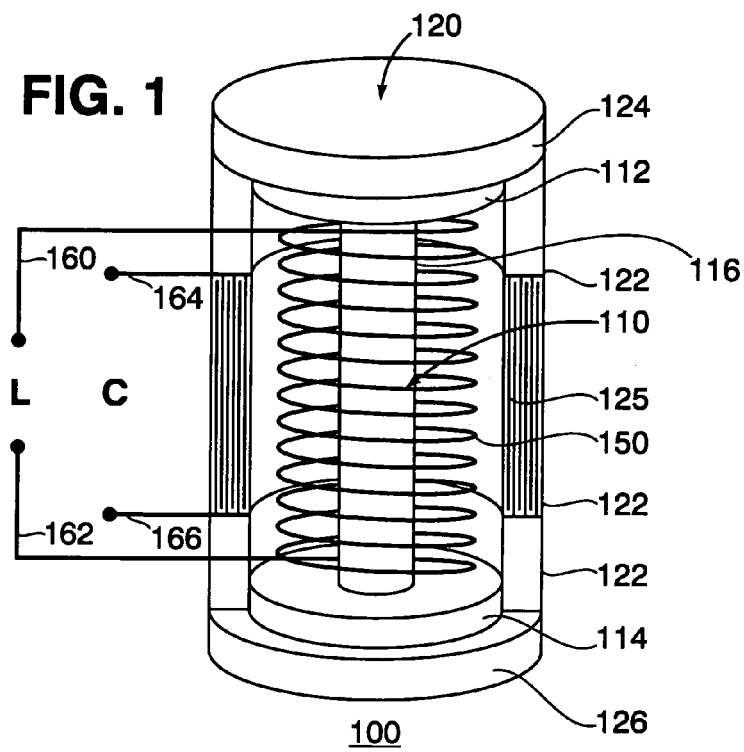
FIG. 1 is a perspective view of a cylindrical hybrid integrated capacitor and inductor device in accordance with an embodiment of the present invention.

FIG. 1 illustrates one embodiment of a hybrid integrated capacitor and inductor device 100, capable of functioning as an independent capacitor and an independent inductor. The hybrid device 100 includes a bobbin 110, which comprises an upper end face 112, a lower end face 114, and an axle 116 that connects the upper end face 112 to the lower end face 114. The bobbin 110 is enclosed by a hollow vessel 120. The hollow vessel 120 includes an outer cylindrical region 122, an upper disk or cover 124, and a lower disk or cover 126. The upper disk or cover 124 encloses a top opening of the hollow vessel 120. The upper disk 124 is also attached to the upper end face 112 of the bobbin. The lower disk or cover 126 closes off a bottom opening. The lower disk 126 is also attached to the lower end face 114 of the bobbin.

The hollow vessel 120 also includes an integrated capacitor element 125 located at the outer cylindrical region 122. The integrated capacitor 125 extends in both longitudinal directions from a central portion of the outer cylindrical region 122. In other words, the integrated capacitor element extends towards both, the upper disk or cover 124 and towards the lower disk or cover 126. The integrated capacitor element 125 may comprise the entire outer cylindrical region 122 of the hollow vessel 120. However, in order to maximize the effects of electric and magnetic fields, the integrated capacitor element 125 may not extend all the way to the extreme ends of the outer cylindrical region 122 adjacent to the top cover 124 and the bottom cover 126.

The hybrid integrated capacitor and inductor device 100 also includes a coil winding 150. The winding 150 is wound around the axle 116 of the bobbin 110, thereby forming an inductive element. Terminals, 160 and 162 are attached to the winding 150. Terminals 164 and 166 are attached to the integrated capacitive element 125. Due to the arrangement of the device, the terminals 160 and 162 are usable independently as inductor terminals enabling use as an inductor. The terminals 164 and 166 are usable independently as capacitor terminals, enabling use as a capacitor. The terminals 160, 162, 164, and 166 would be available from the outside of the cylindrical element.

In the arrangement of FIG. 1, the capacitive element 125 comprises a plurality of alternating ferromagnetic and dielectric layers positioned parallel to the longitudinal axis of the bobbin axle 116. Because of the orientation of the inductive element, i.e., the bobbin 110 and the coil winding 150, with respect to the integrated capacitive element 125, orthogonal electric and magnetic fields coexist within the device 100. As a result, interactive effects such as Hall effects would likely occur, which can cause a reduction in the value of the capacitor as a function of inductor current. AC signal transmission between the inductor and capacitor elements is also likely to occur. These characteristics are beneficial in many applications and are also a function of material characteristics.

With respect to materials, the bobbin core may comprise of powdered iron, which provides a distributed air gap and high saturation flux density. The upper and lower disks or covers may be a ferrite material. When placed on each end of the bobbin, a low loss high permeability flux path is created. As indicated in FIG. 1, portions of the outer cylindrical region 122 that are not occupied by the integrated capacitor element 125, may comprise ferrite materials. Also, the outer cylindrical region 122 may comprise tape wound amorphous metal soft magnetic alloy foil. Different types of foil may be employed for the ferromagnetic layers of the integrated capacitive element 125.

In order to obtain useful repeatable capacitance values with such a device, careful manufacturing techniques must be employed. The dielectric must have a uniform thickness without gaps. The dielectric may be bonded to a smooth copper winding using double-sided adhesive. The dielectric may also be potted using epoxy or another protective material in a vacuum chamber to ensure that there is no entrapped air. Using etched or porous plate surfaces can significantly increase the capacitance. Nano-particles may be attached to copper plated capacitor electrode surfaces in order to increase their surface area and electrical conductivity thereby providing significantly higher capacitance values and reduced losses in both the core integrated capacitor and the winding integrated capacitor. A lower impedance capacitor contact could be made using steel washers.

Figure 2:
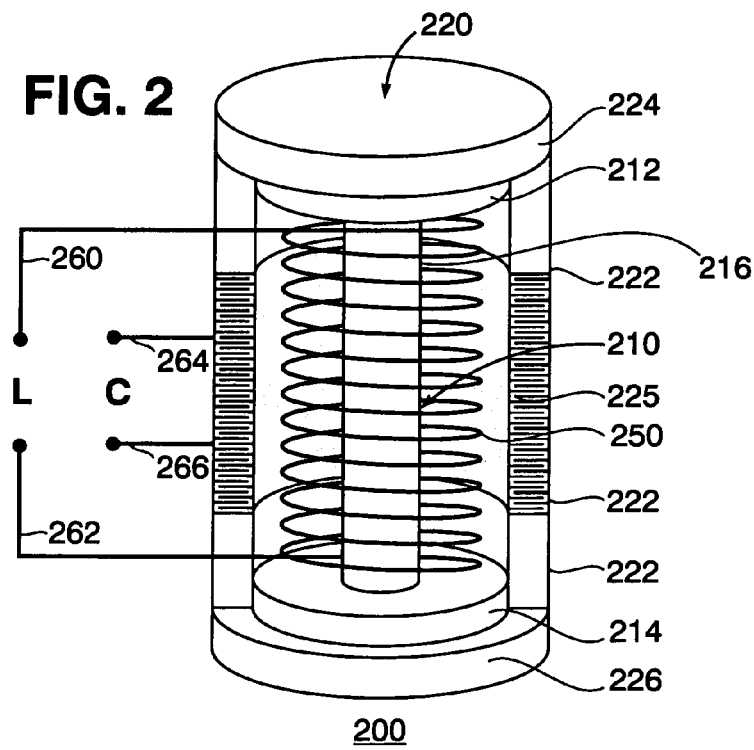
FIG. 2 is a perspective view of a cylindrical hybrid integrated capacitor and inductor device in accordance with another embodiment of the present invention.

FIG. 2 illustrates another embodiment of a hybrid integrated capacitor and inductor device 200, capable of functioning as an independent capacitor and an independent inductor. The embodiment of FIG. 2 is similar to the embodiment of FIG. 1, except for the compositions and orientation of the integrated capacitor element. The hybrid device 200 includes a bobbin 210, which comprises an upper end face 212, a lower end face 214, and an axle 216 that connects the upper end face 212 to the lower end face 214. The bobbin 210 is enclosed by a hollow vessel 220. The hollow vessel 220 includes an outer cylindrical region 222, an upper disk or cover 224, and a lower disk or cover 226. The upper disk or cover 224 encloses a top opening of the hollow vessel 220. The upper disk 224 is also attached to the upper end face 212 of the bobbin. The lower disk or cover 226 closes off a bottom opening. The lower disk 226 is also attached to the lower end face 214 of the bobbin.

The hollow vessel 220 also includes an integrated capacitor element 225 located at the outer cylindrical region 222. The integrated capacitor 225 extends in both longitudinal directions from a central portion of the outer cylindrical region 222. In other words, the integrated capacitor element extends towards both, the upper disk or cover 224 and towards the lower disk or cover 226. The integrated capacitor element 225 may comprise the entire outer cylindrical region 222 of the hollow vessel 220. However, in order to maximize the effects of electric and magnetic fields, the integrated capacitor element 225 may not extend all the way to the extreme ends of the outer cylindrical region 222 adjacent to the top cover 224 and the bottom cover 226.

The hybrid integrated capacitor and inductor device 200 also includes a coil winding 250. The winding 250 is wound around the axle 216 of the bobbin 210, thereby forming an inductive element. Terminals, 260 and 262 are attached to the winding 250. Terminals 264 and 266 are attached to the integrated capacitive element 225. Due to the arrangement of the device, the terminals 260 and 262 are usable independently as inductor terminals enabling use as an inductor. The terminals 264 and 266 are usable independently as capacitor terminals, enabling use as a capacitor. The terminals 260, 262, 264, and 266 would be available from the outside of the cylindrical element.

In the arrangement of FIG. 2, the capacitive element 225 comprises alternating electrically conductive and insulating dielectric disks or washers in a stacked arrangement. The dielectric disks or washers are stacked so that they form dielectric rows that are perpendicular to the longitudinal axis of the bobbin axle 216. The conductive disks are alternately connected to the inner and outer walls of the capacitive element 225 to form the terminals for the parallel plate capacitor element. Because of the orientation of the inductive element, i.e., the bobbin 210 and the coil winding 250, with respect to the integrated capacitive element 225, parallel electric and magnetic fields coexist within the integrated capacitor and inductor device 200. This design should not have Hall Effect interaction, and should therefore provide superior DC capacitance. These characteristics are beneficial in many applications and are also a function of material characteristics.

With respect to materials, the bobbin core may comprise of powdered iron, which provides a distributed air gap and high saturation flux density. The upper and lower disks or covers may be a ferrite material. As indicated in FIG. 2, portions of the outer cylindrical region 222 that are not occupied by the integrated capacitor element 225, may comprise ferrite materials. Also, the outer cylindrical region 222 may comprise tape wound amorphous metal soft magnetic alloy foil. The dielectric of the integrated capacitive element may comprise advanced ceramics.

Figure 3:
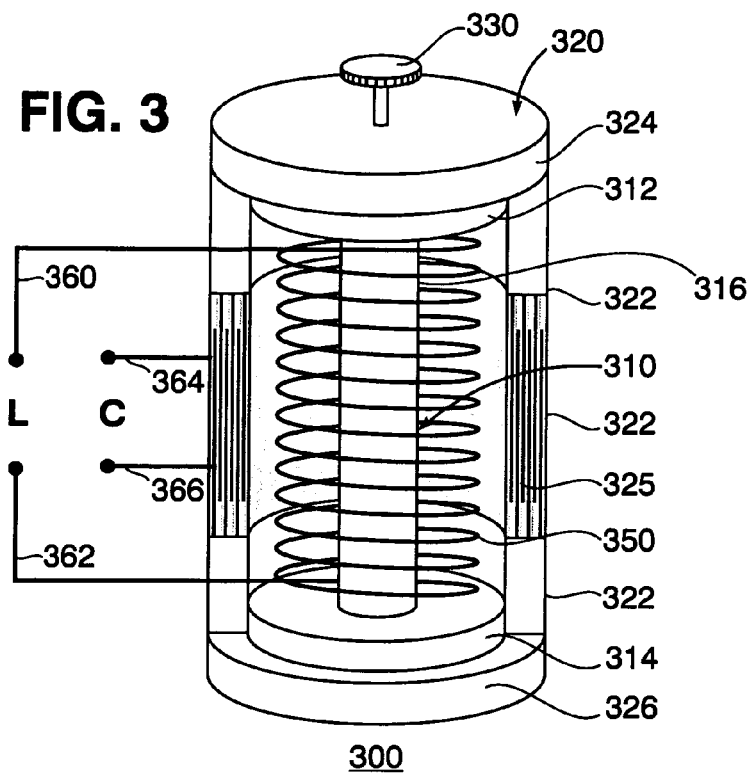
FIG. 3 is a perspective view of a cylindrical hybrid integrated capacitor and inductor device in accordance with another embodiment of the present invention.

FIG. 3 illustrates another embodiment of a hybrid integrated capacitor and inductor device 300, capable of functioning as an independent capacitor and an independent inductor. The embodiment of FIG. 3 is similar to the embodiment of FIGS. 1 and 2, except for the inclusion of an adjustable member to vary the value of the capacitance. The hybrid device 300 includes a bobbin 310, which comprises an upper end face 312, a lower end face 314, and an axle 316 that connects the upper end face 312 to the lower end face 314. The bobbin 310 is enclosed by a hollow vessel 320. The hollow vessel 320 includes an outer cylindrical region 322, an upper disk or cover 324, and a lower disk or cover 326. The upper disk or cover 324 encloses a top opening of the hollow vessel 320. The upper disk 324 is also attached to the upper end face 312 of the bobbin. The lower disk or cover 326 closes off a bottom opening. The lower disk 326 is also attached to the lower end face 314 of the bobbin.

The hollow vessel 320 also includes an integrated capacitor element 325 located at the outer cylindrical region 322. The integrated capacitor 325 extends in both longitudinal directions from a central portion of the outer cylindrical region 322. In other words, the integrated capacitor element extends towards both, the upper disk or cover 324 and towards the lower disk or cover 326. The integrated capacitor element 325 may comprise the entire outer cylindrical region 322 of the hollow vessel 320. However, in order to maximize the effects of electric and magnetic fields, the integrated capacitor element 325 may not extend all the way to the extreme ends of the outer cylindrical region 322 adjacent to the top cover 324 and the bottom cover 326.

The hybrid integrated capacitor and inductor device 300 also includes a coil winding 350. The winding 350 is wound around the axle 316 of the bobbin 310, thereby forming an inductive element. Terminals 360 and 362 are attached to the winding 350. Terminals 364 and 366 are attached to the integrated capacitive element 325. Due to the arrangement of the device, the terminal 360 and 362 are usable independently as inductor terminals enabling use as an inductor. The terminals 364 and 366 are usable independently as capacitor terminals, enabling use as a capacitor. The terminals 360, 362, 364, and 366 would be available from the outside of the cylindrical element.

The hybrid integrated capacitor and inductor device 300 also includes a lead screw mechanism 330 to adjust the value of the capacitance. By turning the lead screw mechanism 330, the capacitance is changed by adjusting the effective surface area of the integrated capacitor element. In the present embodiment, when the lead screw is turned, the foils of the capacitive element may slide apart or together, depending on the direction of rotation. Without departing from the spirit and scope of the invention, any other suitable adjusting means may be used to implement a change in the effective surface area of the integrated capacitor element.

The capacitive element 325 may comprise a plurality of capacitive layers and insulation layers positioned parallel to the longitudinal axis of the bobbin axle 316. Because of the orientation of the inductive element with respect to the integrated capacitive element 320, orthogonal electric and magnetic fields will coexist within the integrated capacitor and inductor apparatus 300. Alternatively, the capacitive element 325 may comprise alternating electrically conductive and insulating dielectric disks or washers in a stacked arrangement. The dielectric disks or washers are stacked so that they form dielectric rows that are perpendicular to the longitudinal axis of the bobbin axle 316. The conductive disks may be alternately connected to the inner and outer walls of the outer cylinder element 325 to form the terminals for the parallel plate capacitor element 325. According to this embodiment, because of the orientation of the inductive element with respect to the integrated capacitive element 325, parallel electric and magnetic fields coexist within the integrated capacitor element 325 and inductor element (310, 350).

Figure 4A:
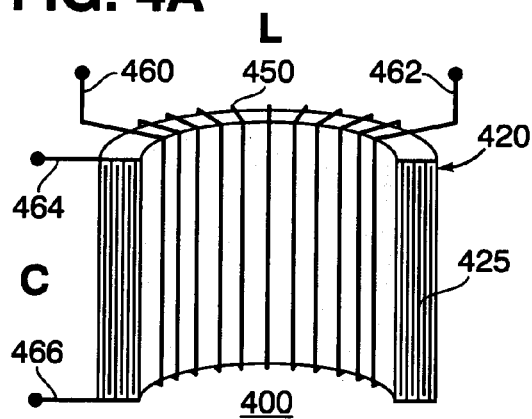
FIG. 4A is a perspective sectional view of a toroidal hybrid integrated capacitor and inductor device in accordance with another embodiment of the present invention.
Figure 4B:
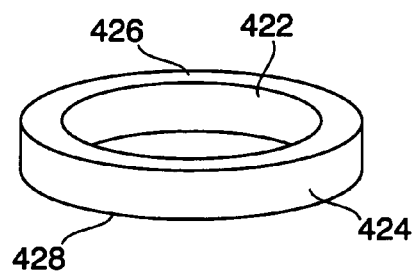
FIG. 4B is a perspective view of a toroidal integrated capacitive element in accordance with another embodiment of the present invention.

FIGS. 4A and 4B illustrate another embodiment of a hybrid integrated capacitor and inductor device 400, capable of functioning as an independent capacitor and an independent inductor. As shown in the sectional view of FIG. 4A, the hybrid integrated capacitor and inductor device 400 includes a hollow vessel 420. In this embodiment, the hollow vessel is an integrated capacitive element having a toroidal shape. FIG. 4B shows the hollow vessel/integrated capacitor element 420. The integrated capacitor element has an inner surface portion 422, an outer surface portion 424, a top surface portion 426, and a bottom surface portion 428. As shown in FIG. 4A, the hybrid device 400 has a coil winding 450. The coil winding is wound so that it traverses the inner surface portion 422, the outer surface portion 424, the top surface portion 426, and the bottom surface portion 428. In other words, the coil winding 450 is arranged so that it is partly inside the hollow vessel 420 and partly outside the hollow vessel 420. An inductive element is formed when the coil winding 450 is wound around capacitive element 420.

FIG. 4A shows terminals 460 and 462 attached to the winding 450. Terminals 464 and 466 are attached to the integrated capacitive element 420. Due to the arrangement of the device, the terminals 460 and 462 are usable independently as inductor terminals enabling use as an inductor. The terminals 464 and 466 are usable independently as capacitor terminals, enabling use as a capacitor. The terminals 460, 462, 464, and 466 would be available from the outside of the cylindrical element. The hybrid device 400 may be packaged inside a casing, preferably plastic, with the terminals available to a user from the outside of the casing.

In the arrangement of FIGS. 4A and 4B, the capacitive element 420 comprises a plurality of alternating ferromagnetic and dielectric layers positioned parallel to the longitudinal axis of the hollow vessel 420. FIG. 4A shows the integrated capacitor orientation at 425. Because of the orientation 425 of the integrated capacitor element with respect to the inductive element, orthogonal electric and magnetic fields coexist within device 400. Different types of metallic foils may be employed for the ferromagnetic layers of the integrated capacitive element 420. In a preferred arrangement for the hybrid device 400, the inner and outer surface portions 422 and 424 may comprise exposed dielectric layers and the top and bottom surface portions 426 and 428 may comprise exposed foil layers. This arrangement maximizes the effects of the coexisting electric and magnetic fields. However, any other combination of dielectric and foil layers may be employed for the surface portions 422, 424, 426, and 428, including arrangements in which all the surfaces are dielectric layers or foil layers. One advantage of the toroidal arrangements of FIGS. 4A and 4B is the reduction of losses by eliminating parallel electric and magnetic fields.

Figure 5A:
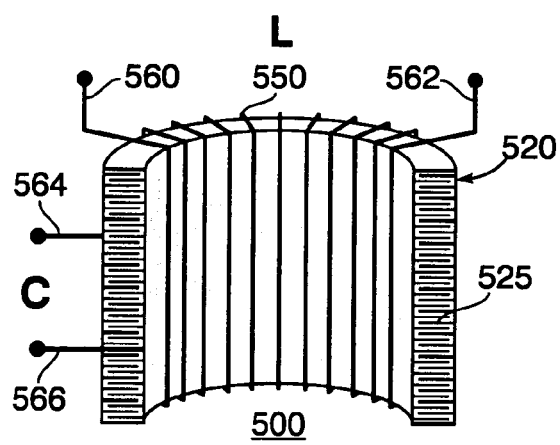
FIG. 5A is a perspective sectional view of a toroidal hybrid integrated capacitor and inductor device in accordance with another embodiment of the present invention.
Figure 5B:
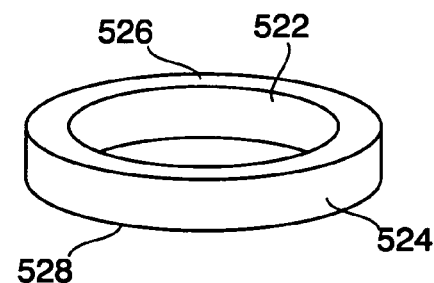
FIG. 5B is a perspective view of a toroidal integrated capacitive element in accordance with another embodiment of the present invention.

FIGS. 5A and 5B illustrate yet another embodiment of a hybrid integrated capacitor and inductor device 500, capable of functioning as an independent capacitor and an independent inductor. As shown in the sectional view of FIG. 5A, the hybrid integrated capacitor and inductor device 500 includes a hollow vessel 520. In this embodiment, the hollow vessel is an integrated capacitive element having a toroidal shape. FIG. 5B shows the hollow vessel/integrated capacitor element 520. The integrated capacitor element has an inner surface portion 522, an outer surface portion 524, a top surface portion 526, and a bottom surface portion 528. As shown in FIG. 5A, the hybrid device 500 has a coil winding 550. The coil winding is wound so that it traverses the inner surface portion 522, the outer surface portion 524, the top surface portion 526, and the bottom surface portion 528. In other words, the coil winding 550 is arranged so that it is partly inside the hollow vessel 520 and partly outside the hollow vessel 520. An inductive element is formed when the coil winding 550 is wound around capacitive element 520.

FIG. 5A shows terminals 560 and 562 attached to the winding 550. Terminals 564 and 566 are attached to the integrated capacitive element 520. Due to the arrangement of the device, the terminals 560 and 562 are usable independently as inductor terminals enabling use as an inductor. The terminals 564 and 566 are usable independently as capacitor terminals, enabling use as a capacitor. The terminals 560, 562, 564, and 566 would be available from the outside of the cylindrical element. The hybrid device 500 may be packaged inside a casing, preferably plastic, with the terminals available to a user from the outside of the casing.

In the arrangement of FIGS. 5A and 5B, the capacitive element 520 comprises alternating electrically conductive and insulating dielectric disks or washers in a stacked arrangement. The dielectric disks or washers are stacked so that they form dielectric rows that are perpendicular to the longitudinal axis of the hollow vessel 520. The conductive disks are alternately connected to the inner and outer walls of the capacitive element 520 to form the terminals for the parallel plate capacitor element. FIG. 5A shows the integrated capacitor orientation at 525. Because of the orientation 525 of the integrated capacitor element with respect to the inductive element, orthogonal electric and magnetic fields coexist within the hybrid device 500. Different types of metallic foils may be employed for the electrically conductive layers of the integrated capacitive element 520. In a preferred arrangement for the hybrid device 500, the inner and outer surface portions 522 and 524 may comprise exposed metallic foil layers and the top and bottom surface portions 526 and 528 may comprise exposed dielectric layers. This arrangement maximizes the effects of the coexisting electric and magnetic fields. However, any other combination of dielectric and foil layers may be employed for the surface portions 522, 524, 526, and 528, including arrangements in which all the surfaces are dielectric layers or foil layers. One advantage of the toroidal arrangements of FIGS. 5A and 5B is the reduction of losses by eliminating parallel electric and magnetic fields.

With respect to the dimensions and the electrical capabilities of the hybrid capacitor and inductor as outlined in the various embodiments, it will be appreciated that the size and the electrical capacity of the device may vary depending upon a desired application. Those of ordinary skill in the art would be able to select the proper capacitance and inductance depending upon given electric requirements. Consequently, the thicknesses of the dielectric and foil layers vary depending on the application of the hybrid capacitor and inductor.

What has been described and illustrated herein are preferred embodiments of the invention along with some variations. The terms, descriptions and figures used herein are set forth by way of illustration only and are not meant as limitations. For instance, many different types of dielectric, metallic, and magnetic materials can be used to make the hybrid integrated capacitor and inductor with various characteristics and cost tradeoffs. For example, metallic materials may include aluminum and copper based materials. Dielectrics may include polypropylene, barium titanate, titanium oxide, and silicone based materials. In the bobbin embodiments, the hollow vessel could be made with more than two materials in order to smooth the transition from high flux density to low flux density core sections. Those skilled in the art will recognize that many variations are possible within the spirit and scope of the invention, which is intended to be defined by the following claims and their equivalents, in which all terms are meant in their broadest reasonable sense unless otherwise indicated.

What is claimed:

1. A hybrid capacitor and inductor device comprising:
   a hollow vessel having, an exposed integrated capacitor element, wherein the exposed integrated capacitor element comprises at least a portion of the hollow vessel, and wherein the hollow vessel is a cylindrical form;
   a coil winding at least partially within the hollow vessel, electrically communicating with the integrated capacitor element;
   a first set of terminals connected to the integrated capacitor element to enable use as a capacitor;
   a second set of terminals connected to the coil winding to enable use as an inductor;
   a bobbin enclosed within the hollow vessel, the bobbin comprising:
      an upper end face;
      a lower end face; and
      an axle connecting the upper end face to the lower end face;
   wherein the hollow vessel comprises:
      an upper cover, and
      a lower cover, wherein the upper end face of the bobbin is attached to the upper cover and a lower end face of the bobbin is attached to the lower cover, and
      wherein the coil winding is wound around the axle of the bobbin and within the hollow vessel.

2. The hybrid capacitor and inductor of claim 1, further including an adjustable element for adjusting the effective surface area of the capacitor element, to adjust the capacitance of the device.

3. The hybrid capacitor and inductor of claim 1, wherein the integrated capacitor element comprises a plurality of capacitive layers positioned parallel to a longitudinal axis of the bobbin axle, to create orthogonal electric and magnetic fields.

4. The hybrid capacitor and inductor of claim 1, wherein the integrated capacitor element comprises a plurality of stacked layers with each stacked layer perpendicular to a longitudinal axis of the bobbin axle, to create parallel electric and magnetic fields.

5. A hybrid capacitor and inductor device comprising:
a hollow vessel having, an exposed integrated capacitor element, wherein the exposed integrated capacitor element comprises at least a portion of the hollow vessel, and wherein the hollow vessel is a toroidal form;
a coil winding at least partially within the hollow vessel, electrically communicating with the integrated capacitor element;
a first set of terminals connected to the integrated capacitor element to enable use as a capacitor;
a second set of terminals connected to the coil winding to enable use as an inductor; wherein the hollow vessel comprises:
an inner surface portion;
an outer surface portion;
a top surface portion; and
a bottom surface portion, wherein the coil winding is wound around the inner surface portion, the outer surface portion, the top surface portion, and the bottom surface portion, wherein the inner surface portion, the outer surface portion, the top surface portion and bottom surface portion each comprise one of a dielectric layer or a ferromagnetic layer.

6. A hybrid capacitor and inductor device comprising:
a hollow vessel having, an exposed integrated capacitor element, wherein the exposed integrated capacitor element comprises at least a portion of the hollow vessel, and wherein the hollow vessel is a toroidal form;
a coil winding at least partially within the hollow vessel, electrically communicating with the integrated capacitor element;
a first set of terminals connected to the integrated capacitor element to enable use as a capacitor;
a second set of terminals connected to the coil winding to enable use as an inductor; wherein the hollow vessel comprises:
an inner surface portion;
an outer surface portion;
a top surface portion; and
a bottom surface portion, wherein the coil winding is wound around the inner surface portion, the outer surface portion, the top surface portion and the bottom surface portion, wherein the inner surface portion and the outer surface portion each comprise a dielectric layer, and the top surface portion and bottom surface portions each comprise a ferromagnetic layer.

7. The hybrid capacitor and inductor device of claim 6, wherein the integrated capacitive element comprises a plurality of parallel dielectric and ferromagnetic layers, the parallel layers arranged perpendicular to the plane of the top surface portion and the bottom surface portion.

8. A hybrid capacitor and inductor device comprising:
a hollow vessel having, an exposed integrated capacitor element, wherein the exposed integrated capacitor element comprises at least a portion of the hollow vessel, and wherein the hollow vessel is a toroidal form;
a coil winding at least partially within the hollow vessel, electrically communicating with the integrated capacitor element;
a first set of terminals connected to the integrated capacitor element to enable use as a capacitor;
a second set of terminals connected to the coil winding to enable use as an inductor; wherein the hollow vessel comprises:
an inner surface portion;
an outer surface portion;
a top surface portion; and
a bottom surface portion, wherein the coil winding is wound around the inner surface portion, the outer surface portion, the top surface portion and the bottom surface portion, wherein the inner surface portion and the outer surface portions each comprise a ferromagnetic layer, and the top surface portion and bottom surface portions each comprise a dielectric layer.

9. The hybrid capacitor and inductor device of claim 8, wherein the integrated capacitive element comprises a plurality of stacked parallel dielectric and ferromagnetic layers, the stacked parallel layers arranged parallel to the plane of the top surface portion and the bottom surface portion.

10. An integrated capacitor and inductor device comprising:
a hollow vessel comprising:
an upper cover,
a lower cover, and
an exposed integrated capacitor element, wherein the hollow vessel has a cylindrical shape;
a bobbin enclosed within the hollow vessel, the bobbin comprising:
an upper end face,
a lower end face, and
an axle connecting the upper end face to the lower end face, the upper end face contacting the upper cover and a lower end face contacting the lower cover;
a coil winding around the bobbin and within the hollow vessel; and
four terminals to enable separate use as a capacitor and an inductor, with two of the four terminals connected to the coil windings and the other two of the four terminals connected to the integrated capacitor element.

11. The integrated capacitor and inductor device of claim 10, wherein the bobbin comprises, powdered iron, and the upper and lower disks are formed of a ferrite material.

12. The integrated capacitor and inductor of claim 11, wherein the integrated capacitor element comprises a plurality of capacitive layers positioned parallel to a longitudinal axis of the bobbin axle, to create orthogonal electric and magnetic fields.

13. The integrated capacitor and inductor of claim 12, having an adjustable element for adjusting the effective surface area of the capacitor element, to adjust the capacitance of the device.

14. The integrated capacitor and inductor device of claim 11, wherein the integrated capacitor element comprises a plurality of stacked capacitive layers, the stacked layers positioned perpendicular to a longitudinal axis of the bobbin axle, to created parallel electric and magnetic fields.

15. The integrated capacitor and inductor of claim 14, having an adjustable element for adjusting the effective surface area of the capacitor element, to adjust the capacitance of the device.

16. An integrated capacitor and inductor device comprising:

a hollow vessel having a toroidal shape;

an exposed integrated capacitor element, wherein the exposed integrated capacitor element comprises at least a portion of the hollow vessel, the hollow vessel comprising:
  an inner surface portion,
  an outer surface portion,
  a top surface portion, and
  a bottom surface portion;

a coil winding at least partially within the hollow vessel, and at least partially outside the hollow vessel, electrically communicating with the integrated capacitor element; and four terminals to enable separate use as a capacitor and an inductor, with two of the four terminals connected to the coil windings and the other two of the four terminals connected to the integrated capacitor element, wherein coil winding is wound around the inner surface portion, the outer surface portion, the top surface portion, and the bottom surface portion, wherein the inner surface portion and the outer surface portion each comprise one of a ferromagnetic layer or a dielectric layer, and wherein the top surface portion and bottom surface portion each comprise one of a ferromagnetic layer or a dielectric layer.

17. The integrated capacitor and inductor of claim 16, wherein the apparatus is packaged in a plastic casing with four terminals available from the outside of the plastic casing.

18. The integrated capacitor and inductor of claim 16 wherein the top surface portion and the bottom surface portion both comprise a ferromagnetic layer, and the inner surface portion and the outer surface portion both comprise a dielectric layer, and the capacitive element comprises a plurality of parallel dielectric and ferromagnetic layers, the parallel layers arranged perpendicular to the plane of the top surface and bottom surface portions.

19. The integrated capacitor and inductor of claim 16 wherein the top surface portion and the bottom surface portion both comprise a dielectric layer, and the inner surface portion and the outer surface portion both comprise a ferromagnetic layer, and the capacitive element comprises a plurality of stacked parallel dielectric and ferromagnetic layers, the stacked parallel layers arranged parallel to the plane of the top and bottom surface portions.

* * * * *